(12) United States Patent
Herbig et al.

(10) Patent No.: US 11,798,576 B2
(45) Date of Patent: Oct. 24, 2023

(54) METHODS AND APPARATUS FOR ADAPTIVE GAIN CONTROL IN A COMMUNICATION SYSTEM

(71) Applicant: Cerence Operating Company, Burlington, MA (US)

(72) Inventors: Tobias Herbig, Ulm (DE); Meik Pfeffinger, Ulm (DE); Bernd Iser, Ulm (DE)

(73) Assignee: Cerence Operating Company, Burlington, MA (US)

( * ) Notice: Subject to any disclaimer, the term of this patent is extended or adjusted under 35 U.S.C. 154(b) by 554 days.

(21) Appl. No.: 16/671,830

(22) Filed: Nov. 1, 2019

(65) Prior Publication Data

US 2020/0176012 A1 Jun. 4, 2020

Related U.S. Application Data

(63) Continuation of application No. 15/115,804, filed as application No. PCT/US2014/018905 on Feb. 27, 2014, now abandoned.

(51) Int. Cl.
| | |
|---|---|
| *G10L 21/02* | (2013.01) |
| *G10L 21/034* | (2013.01) |
| *H03G 3/32* | (2006.01) |
| *G10L 21/0232* | (2013.01) |
| *H04R 3/00* | (2006.01) |

(Continued)

(52) U.S. Cl.
CPC ............ *G10L 21/034* (2013.01); *G10L 21/02* (2013.01); *G10L 21/0232* (2013.01); *G10L 25/81* (2013.01); *H03G 3/3089* (2013.01); *H03G 3/32* (2013.01); *H04R 3/00* (2013.01); *H04R 3/005* (2013.01); *H04R 3/12* (2013.01); *G10L 21/0208* (2013.01); *G10L 21/0324* (2013.01); *G10L 25/78* (2013.01); *H04R 27/00* (2013.01); *H04R 2430/01* (2013.01); *H04R 2499/13* (2013.01)

(58) Field of Classification Search
None
See application file for complete search history.

(56) References Cited

U.S. PATENT DOCUMENTS

| | | | | |
|---|---|---|---|---|
| 7,171,003 | B1 ‡ | 1/2007 | Venkatesh | ................ H03G 3/32 381/66 |
| 8,538,763 | B2 ‡ | 9/2013 | Yu | ........................ G10L 21/0208 704/200 |

(Continued)

FOREIGN PATENT DOCUMENTS

| | | | |
|---|---|---|---|
| EP | 2416593 A1 | ‡ | 2/2012 |
| EP | 2490459 A1 | ‡ | 8/2012 |

(Continued)

*Primary Examiner* — Richard Z Zhu
(74) *Attorney, Agent, or Firm* — Occhiuti & Rohlicek LLP

(57) ABSTRACT

Methods and apparatus for a communication system having microphones and loudspeakers to determine a noise and speech level estimate for a transformed signal, determine a SNR from the noise and speech level estimates, and determine a gain for the transformed signal to achieve a selected SNR range at a given position. In one embodiment, the gain is determined by adapting an actual gain to follow a target gain, wherein the target gain is adjusted to achieve the selected SNR range.

20 Claims, 9 Drawing Sheets

(51) Int. Cl.
*H03G 3/30* (2006.01)
*G10L 25/81* (2013.01)
*H04R 3/12* (2006.01)
G10L 25/78 (2013.01)
G10L 21/0208 (2013.01)
G10L 21/0324 (2013.01)
H04R 27/00 (2006.01)

(56) References Cited

U.S. PATENT DOCUMENTS

| | | | | |
|---|---|---|---|---|
| 8,560,320 | B2 ‡ | 10/2013 | Yu | G10L 19/0204 704/226 |
| 8,583,426 | B2 ‡ | 11/2013 | Yu | G10L 21/0364 704/200 |
| 8,989,403 | B2 ‡ | 3/2015 | Furuta | G10L 21/0208 381/94.3 |
| 9,124,234 | B1 * | 9/2015 | Petrovic | H03G 3/3078 |
| 9,318,119 | B2 ‡ | 4/2016 | Sugiyama | G10L 21/0208 |
| 2002/0041695 | A1 * | 4/2002 | Luo | H04R 25/552 381/313 |
| 2003/0059034 | A1 ‡ | 3/2003 | Etter | H03G 7/06 379/39 |
| 2004/0091123 | A1 ‡ | 5/2004 | Stark | H04B 1/082 381/86 |
| 2005/0027520 | A1 ‡ | 2/2005 | Mattila | G10L 21/0208 704/22 |
| 2006/0262938 | A1 ‡ | 11/2006 | Gauger | G10L 21/02 381/56 |
| 2006/0270467 | A1 ‡ | 11/2006 | Song | G10L 21/0208 455/57 |
| 2009/0028180 | A1 | 1/2009 | Strater et al. | |
| 2009/0281802 | A1 ‡ | 11/2009 | Thyssen | G10L 21/0208 704/22 |
| 2010/0001978 | A1 | 1/2010 | Lynch et al. | |
| 2010/0019781 | A1 * | 1/2010 | Woelfl | H04R 3/00 324/691 |
| 2010/0035663 | A1 * | 2/2010 | Haulick | H04M 1/6083 455/569.2 |
| 2010/0202631 | A1 * | 8/2010 | Short | H03G 3/32 381/104 |
| 2011/0095875 | A1 ‡ | 4/2011 | Thyssen | G09G 5/10 340/40 |
| 2013/0017916 | A1 | 1/2013 | Sada et al. | |
| 2013/0179163 | A1 * | 7/2013 | Herbig | H04R 27/00 704/233 |
| 2014/0219486 | A1 * | 8/2014 | Brown | H04R 25/505 381/320 |

FOREIGN PATENT DOCUMENTS

| | | |
|---|---|---|
| EP | 2615853 A2 | 7/2013 |
| EP | 14883804.8 ‡ | 9/2016 |
| JP | 2013062609 A | 4/2013 |
| WO | 2012044471 A1 | 4/2012 |
| WO | WO 2012 044471 A1 ‡ | 4/2012 |
| WO | WO 2013 058728 A1 ‡ | 4/2013 |
| WO | PCT/US2014/018905 ‡ | 11/2014 |

\* cited by examiner
‡ imported from a related application

METHODS AND APPARATUS FOR ADAPTIVE GAIN CONTROL IN A COMMUNICATION SYSTEM

CROSS REFERENCE TO RELATED APPLICATIONS

This application is a Continuation of U.S. application Ser. No. 15/115,804, filed on Aug. 1, 2016, which is a National Stage application of PCT/US2014/018905 filed on Feb. 27, 2014, published in the English language on Sep. 3, 2015 as International Publication Number WO 2015/130283 A1, entitled: "Methods And Apparatus For Adaptive Gain Control In A Communication System" all of which are incorporated herein by reference in their entirety.

BACKGROUND

As is known in the art, certain communication systems, such as in-car communication (ICC) systems, enable passengers in a car to communicate with each other in a more comfortable manner. Conventional systems can include microphones and loudspeakers to receive and transmit sound within the car. For example an ICC system can enable a driver to focus on the road while talking to passengers in the rear of the car without turning towards a passenger. Due to the driver's forward-facing head orientation, the driver may have to speak loudly in order to compensate for acoustic loss. For the reverse problem of having a conversation from rear to front, the problem is less dominant but still present.

SUMMARY

In exemplary embodiments of the invention, a communication system includes a series of microphones for picking up the speech of a speaker by performing speech enhancement processing. The system can play back the enhanced speech signal via loudspeakers dedicated to the listener. The system provides a relatively constant audio impression for a variety of noise and driving conditions.

In general, a communication system in accordance with exemplary embodiments of the invention optimizes gain control to achieve an improved audio impression. A target function for gain control can take psychoacoustic effects into consideration, provide improved gain adaptation, and enable a relatively compact implementation. With this arrangement, a system is provided with considerably reduced tuning effort and more natural audio impression as compared with conventional systems.

In exemplary embodiments, a communication system fuses AGC (automatic gain control), which compensates for speaker-dependent speech volumes, and NDGC (noise dependent gain control), which provides voice amplification in adverse environments. In some embodiments, loss control, which is used to switch between front and rear passengers, can also be fused into a unitary gain control module that uses a target function for gain control.

In one embodiment, a communication system provides a relatively constant audio impression for listeners given by a predefined Signal-To-Noise (SNR) target range at the listener's position. When AGC and NDGC are combined with loss control, a flexible gain provides fast switching in cross-talk scenarios and smooth transitions when the background noise changes. A more natural audio impression can be achieved by using psychoacoustic measures to determine the actual SNR and the target SNR.

In one aspect of the invention, a method comprises: for a communication system having microphones and loudspeakers, transforming a signal received by a first one of the microphones to the frequency domain; determining a noise level estimate for the transformed signal; determining a speech level estimate for the transformed signal; determining a SNR from the noise and speech level estimates; and determining a gain for the transformed signal to achieve a selected SNR range at a given position, wherein determining the gain comprises: adapting an actual gain to follow a target gain, wherein the target gain is adjusted to achieve the selected SNR range; comparing the target gain and the actual gain to determine a gain change increment; increasing the actual gain if the SNR at the given position is lower than a minimum SNR in the SNR range; and decreasing the actual gain if the SNR at the given position is higher than a maximum SNR in the SNR range.

The method can further include one or more of the following features: adapting the SNR range in response to a change in the noise level, using a psychoacoustic measure for determining the noise and/or speech level estimate, determining a noise level estimate for the transformed signal using spectral weights based upon the psychoacoustic measure, performing voice activity detection on the transformed signal and generating weighting factors from the voice activity detection to detect an active speaker, determining mixer weights to select a speaker-specific gain for the active speaker, attenuating the gain during speech pauses detected by the voice activity detection, determining the gain for different frequencies, in a bi-directional system, setting a maximum gain to block a loudspeaker output of an inactive communication system, using a first one of the microphones to determine the SNR at the given position, and/or the given position corresponds to a position proximate an expected location of a user ear.

In another aspect of the invention, an article comprises: a non-transitory computer-readable medium having stored instructions that enable a machine to: for a communication system having microphones and loudspeakers, transform a signal received by a first one of the microphones to the frequency domain; determine a noise level estimate for the transformed signal; determine a speech level estimate for the transformed signal; determine a SNR from the noise and speech level estimates; and determine a gain for the transformed signal to achieve a selected SNR range at a given position, wherein determining the gain comprises: adapt an actual gain to follow a target gain, wherein the target gain is adjusted to achieve the selected SNR range; compare the target gain and the actual gain to determine a gain change increment; increase the actual gain if the SNR at the given position is lower than a minimum SNR in the SNR range; and decrease the actual gain if the SNR at the given position is higher than a maximum SNR in the SNR range.

The article can further include one or more of the following features: instructions to adapt the SNR range in response to a change in the noise level, instructions to use a psychoacoustic measure for determining the noise and/or speech level estimate, instructions to perform voice activity detection on the transformed signal and generate weighting factors from the voice activity detection to detect an active speaker, instructions to determine mixer weights to select a speaker-specific gain for the active speaker, and/or, in a bi-directional system, instructions to set a maximum gain to block a loudspeaker output of an inactive communication system.

In a further aspect of the invention, a communication system comprises: microphones to receive sound in an enclosed environment; loudspeakers to generate sound into the enclosed environment; a sound processing module to transform a signal received by a first one of the microphones to the frequency domain; a noise estimate module to determine a noise level estimate for the transformed signal; a speech estimate module to determine a speech level estimate for the transformed signal; a gain control module comprising: a SNR module to determine a SNR from the noise and speech level estimates; and a gain module to determine a gain for the transformed signal to achieve a selected SNR range at a given position, the gain module including a processor configured to: adapt an actual gain to follow a target gain, wherein the target gain is adjusted to achieve the selected SNR range; compare the target gain and the actual gain to determine a gain change increment; increase the actual gain if the SNR at the given position is lower than a minimum SNR in the SNR range; and/or decrease the actual gain if the SNR at the given position is higher than a maximum SNR in the SNR range.

The system can further be configured to include one or more of the following features: the gain module is further configured to adapt the SNR range in response to a change in the noise level, use a psychoacoustic measure for determining the noise and/or speech level estimate, determine a noise level estimate for the transformed signal using spectral weights based upon the psychoacoustic measure, perform voice activity detection on the transformed signal and generate weighting factors from the voice activity detection to detect an active speaker, determine mixer weights to select a speaker-specific gain for the active speaker, attenuate the gain during speech pauses detected by the voice activity detection, determine the gain for different frequencies, in a bi-directional system, set a maximum gain to block a loudspeaker output of an inactive communication system, use a first one of the microphones to determine the SNR at the given position, and/or the given position corresponds to a position proximate an expected location of a user ear.

BRIEF DESCRIPTION OF THE DRAWINGS

The foregoing features of this invention, as well as the invention itself, may be more fully understood from the following description of the drawings in which.

DETAILED DESCRIPTION

Figure 1:
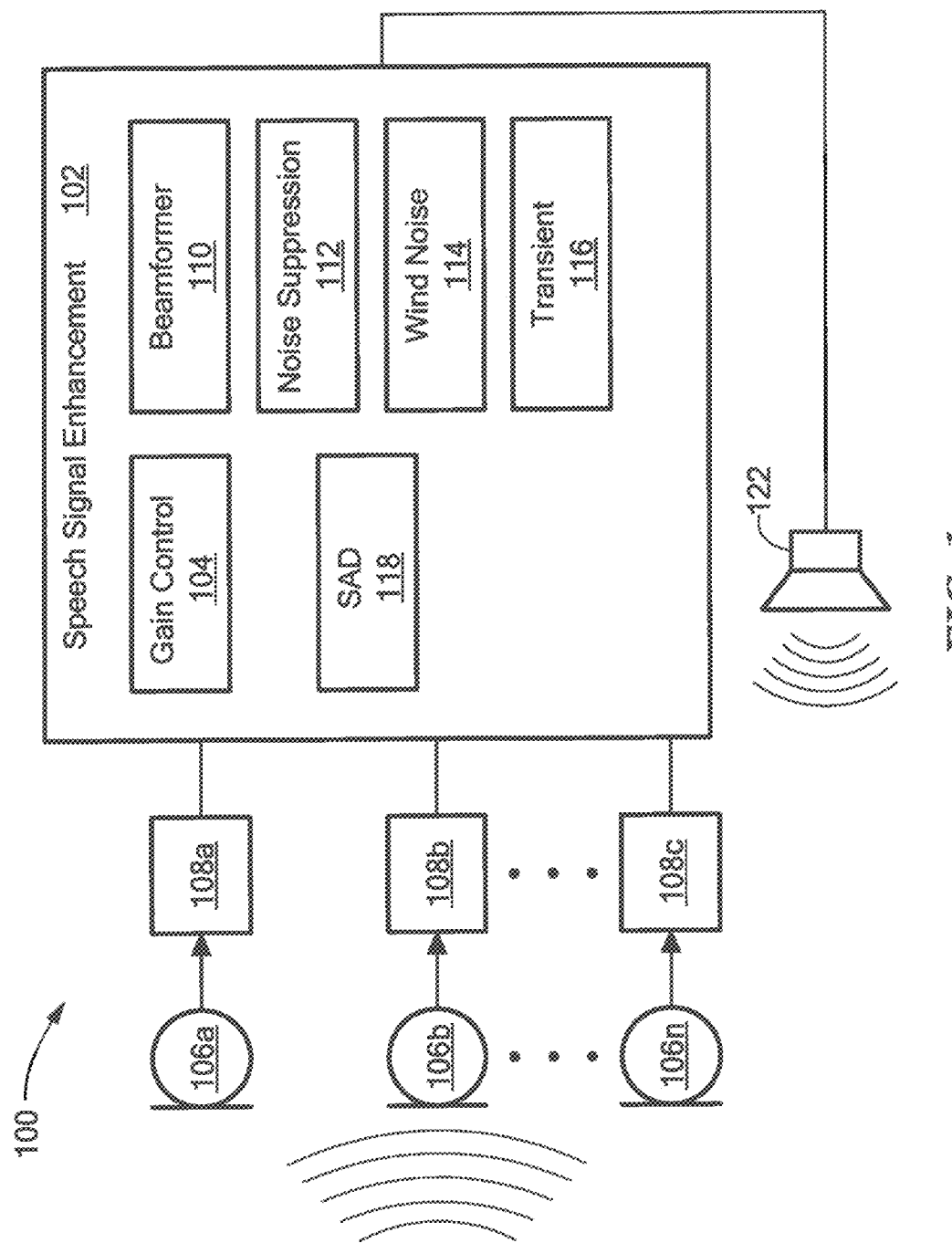
FIG. 1 is a schematic representation of a communication system having gain control in accordance with exemplary embodiments of the invention.

FIG. 1 shows an exemplary communication system 100 including a speech signal enhancement system 102 having a gain control module 104 in accordance with exemplary embodiments of the invention. A microphone array 106 includes one or more microphones 106a-N to receive sound information, such as speech from a human speaker.

It is understood that any practical number of microphones 106 can be used to form a microphone array. Respective pre-processing modules 108a-N can process information from the microphones 106a-N. Exemplary pre-processing modules 108 can include echo cancellation. Additional signal processing modules can include beamforming 110, noise suppression 112, wind noise suppression 114, transient removal 116, speaker/voice activity detection 118, etc.

While exemplary embodiments of the invention are shown and described in conjunction with an in car communication (ICC) system, it is understood that embodiments of the invention are applicable to communication systems in general in which SNR-based gain control is desirable within an enclosed space.

Figure 2A:
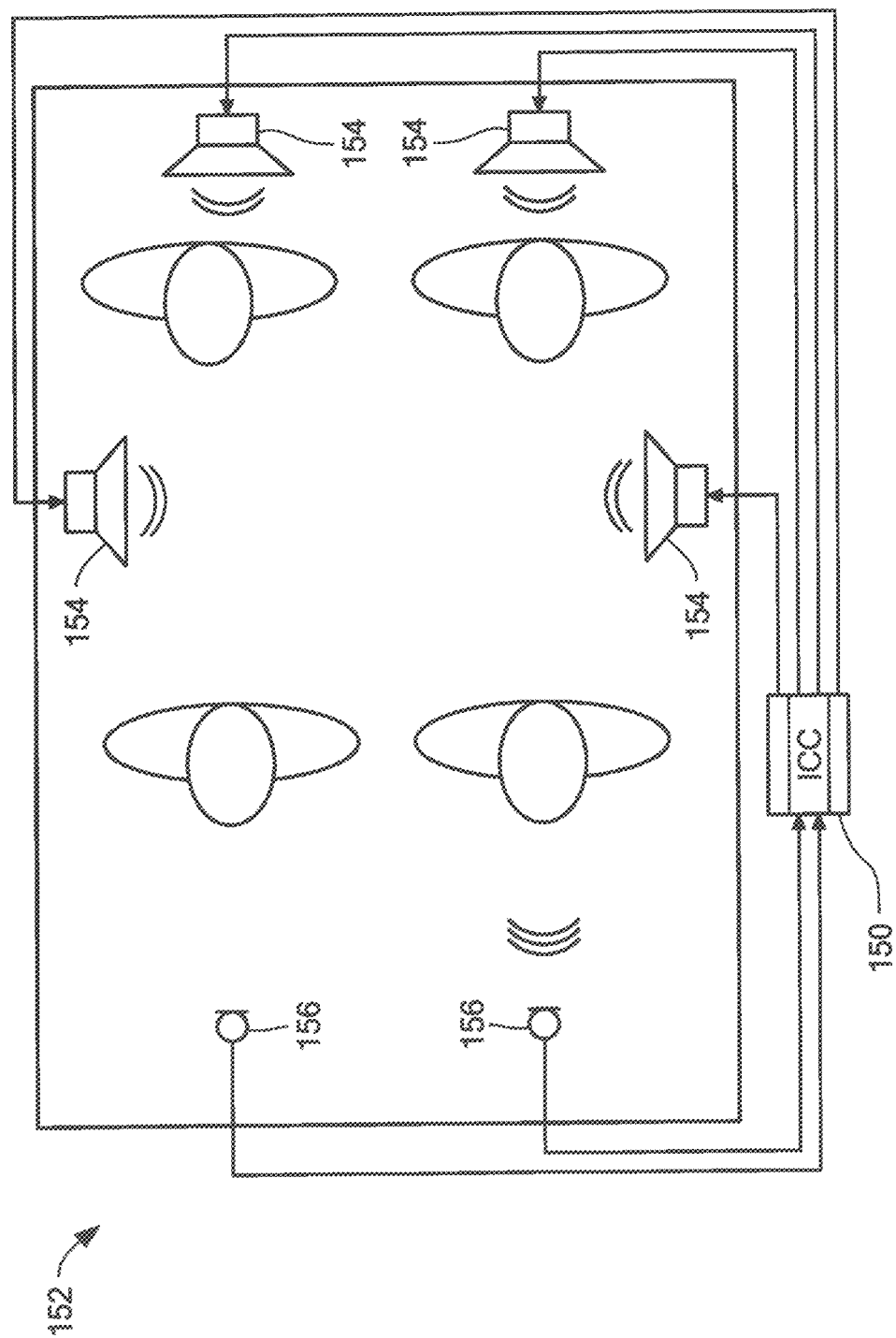
FIG. 2A is a schematic representation of a unidirectional in car communication system having gain control.

FIG. 2A shows a unidirectional in car communication (ICC) system 150. A vehicle 152 includes a series of loudspeakers 154 and microphones 156 within the passenger compartment. In one embodiment, the passenger compartment includes a microphone 156 for each passenger. In another embodiment (not shown), each passenger has a microphone array.

In general, the system 150 should achieve a relatively constant audio impression for a variety of noise and driving conditions. One or more microphones 156 are directed to the driver and the front passenger. Speech enhancement is applied to the microphone 156 signals, as described more fully below.

Figure 2B:
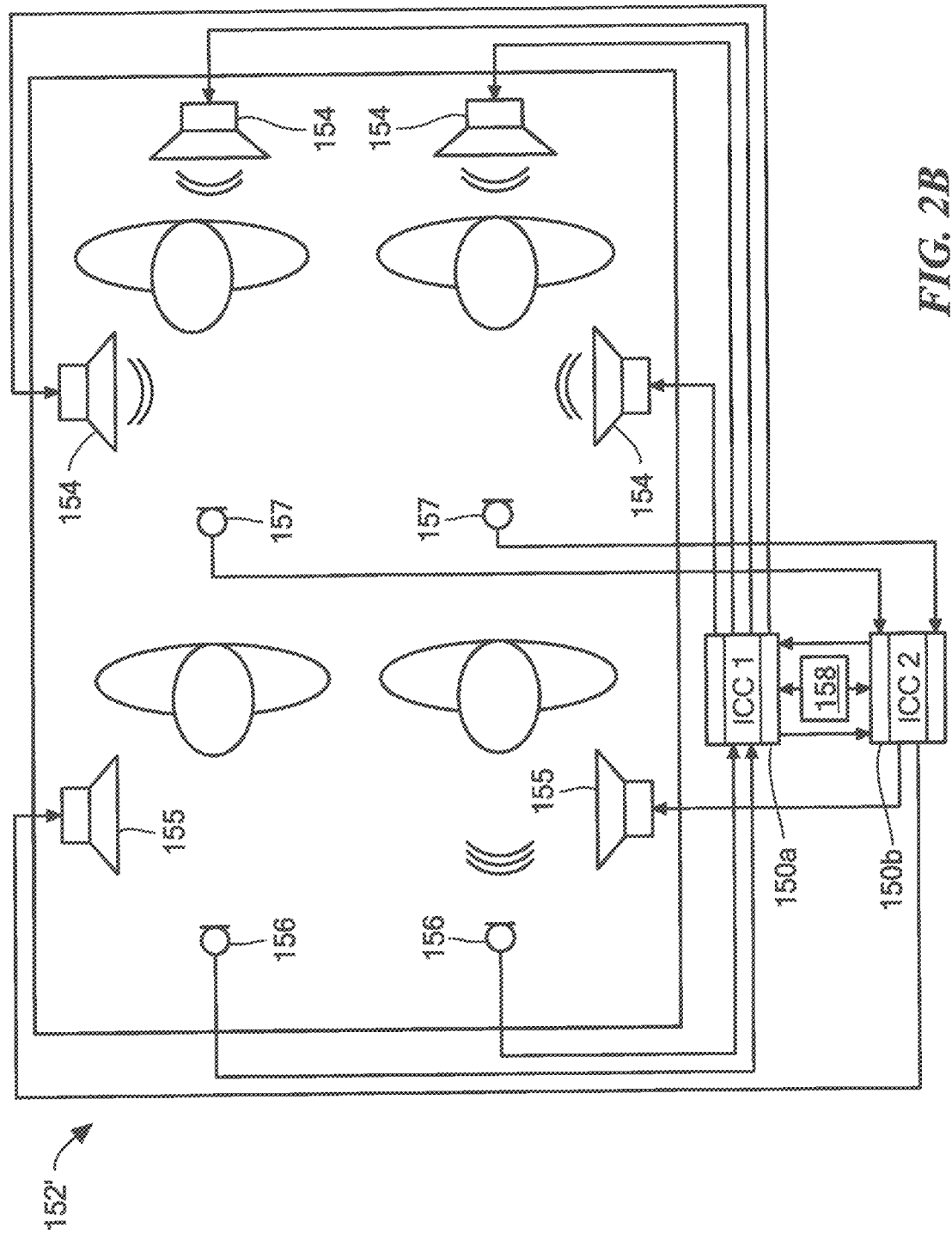
FIG. 2B is a schematic representation of a bidirectional in car communication system having gain control.

FIG. 2B shows a vehicle 152' having first and second ICC systems 150a,b to provide bidirectional operation. As described more fully below, a loss control module 158 can be provided to apply appropriate attenuation for the inactive ICC system.

Bidirectional communication is provided in which speech signals originating from rear speakers are picked up by additional microphones 157 in the rear of the car. The speech signal is enhanced and amplified before it is played back over front loudspeakers 155. Front loudspeakers 155 and rear microphones 157 are added over the unidirectional embodiment of FIG. 2A Both front-to-rear and rear-to-front communication are typically calculated more or less independently from each other by the respective ICC systems 150a, 150b. In exemplary embodiments, the first and second ICC systems 150a,b are used in parallel. However, in exemplary embodiments, only one direction is active in order to avoid instabilities caused by feedback from loudspeakers of one direction into the microphones of the opposite direction.

In general, bidirectional communication is more convenient for rear and front passengers. Using more microphones allows retrieval of more precise information about the acoustic environment within the car. Having only one ICC system 150a,b active at any given time avoids the speech of rear passengers being picked up by front microphones and played back again to the rear passengers.

The ICC system 150 compensates for acoustic loss between passengers in a car or other enclosed space. The communication system 150 can use a number of microphones 156 for picking up the speech of a speaker, performing speech enhancement, and playing back the enhanced speech signal via loudspeakers 154 dedicated to the listener. Voice amplification can compensate for the acoustic loss from the speaker's mouth to the listener's ear.

As described more fully below, signal gain is controlled depending on the speaker's speech volume and the surrounding background noise level. Appropriate equalizing ensures stability of the system and sound quality. The enhanced speech signal is played back over the rear loudspeakers 154 of the car. Equalization and gain control preserve the natural localization of the speaker. The listener should still have the impression that the speech signal is coming from the speaker, e.g. driver or front passenger, and not from the loudspeaker. However, the speaker does not want to be aware of the speaker's voice played back over the loudspeakers.

Figure 3:
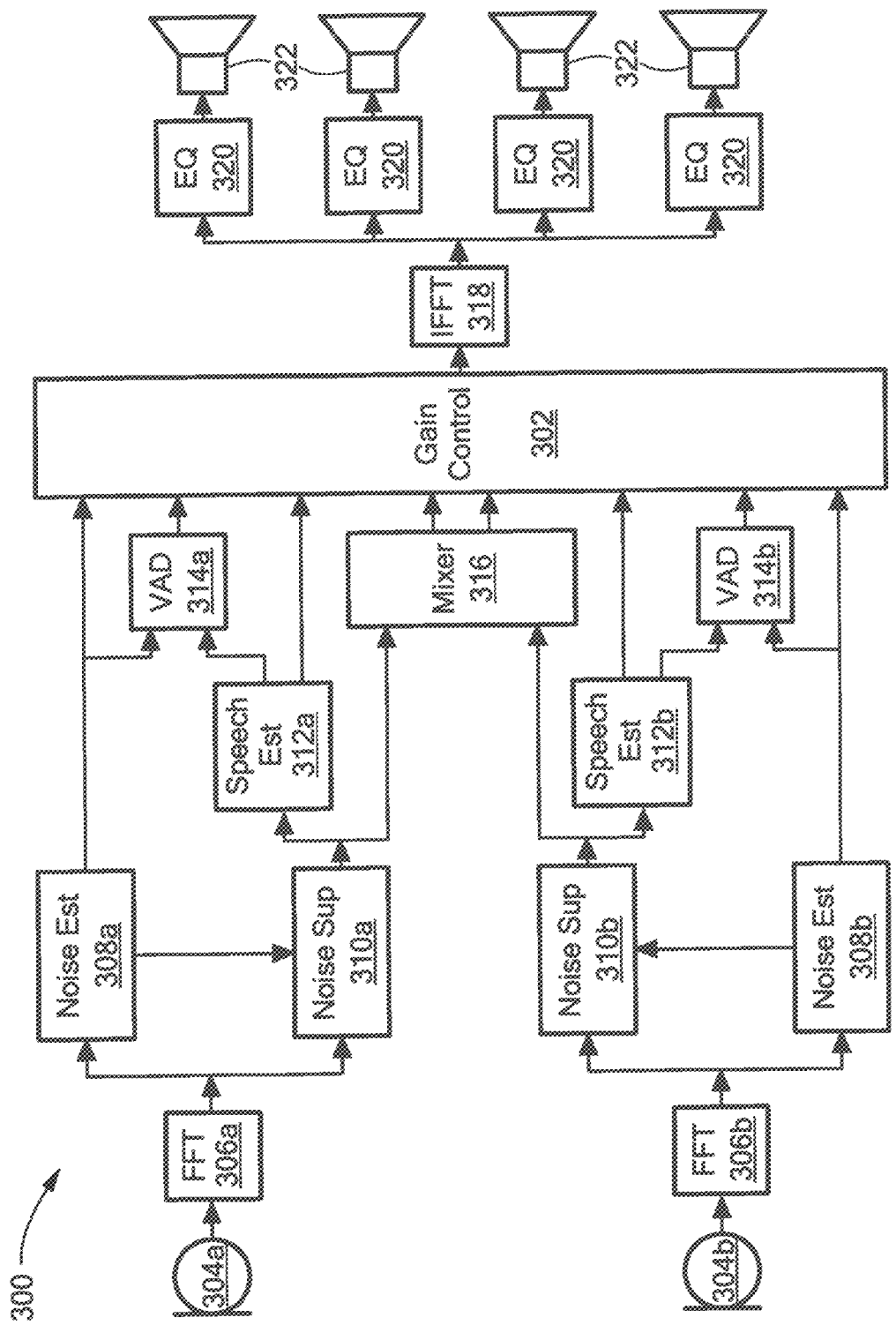
FIG. 3 is a schematic representation of a communication system having microphones and loudspeakers and gain control.

FIG. 3 shows an exemplary communication system 300 having gain control 302 in accordance with exemplary embodiments of the invention. Signals from microphones 304a,b are first high-pass filtered to suppress low-frequency background noise (not shown). The filtered microphone 304 signal is then transformed by a filter bank into frequency domain, such as by FFT processing modules 306a,b. In parallel, the microphone noise levels are tracked in respective noise estimation modules 308a,b.

Noise suppression modules 310a,b can calculate frequency domain spectral weighting coefficients to moderate sibilant sounds (de-essing) and to suppress background noise, for example, in the microphone signals. As is known in the art, De-essing refers to any technique for reducing excessive prominence of sibilant consonants, such as "s", "z" and "sh" in recordings of the human voice. Excessive sibilance can be caused by compression, microphone choice and technique, and the like. Sibilance typically lies in frequencies between 2-10 kHz.

Speech estimation modules 312a,b receive the noise suppressed microphone signals and output respective speech estimate signals that are provided to the gain control module 302 and respective voice activity detection modules 314a,b. Generation of speech estimate signals can be performed using any suitable technique known to one of ordinary skill in the art.

A mixer 316 detects which speaker, e.g. driver or front-passenger, is talking. Feedback suppression detects residual feedback artifacts (from loudspeaker to microphone) and applies temporal attenuation if required.

As described more fully below, the gain control module 302 provides Automatic Gain Control (AGC) and Noise Dependent Gain Control (NDGC) to control the overall amplification of the speaker's speech signal. After transformation back to the time domain, such as by an IFFT module 318, the enhanced signal is then split into a number of output channels each of which is coupled to a respective equalizer 320. Each signal played back over a loudspeaker or loudspeaker pair 322 dedicated to the corresponding output channel.

Since Voice Activity Detection (VAD) 314 is used prior to gain control 302, the system can handle speech utterances and speech pauses appropriately, e.g., by reducing the gain during long speech pauses. Noise estimation 308 and speech level estimation 312 are calculated in frequency domain to allow spectral weighting. In one embodiment, noise estimation 308 includes the use of spectral weights according to the ITU-R 468 standard, which is based on psychoacoustic experiments under the objective to obtain aurally compensated noise estimates.

In one embodiment, speech level estimation 312 uses so-called A-/B-/C-weighting in order to approximate the well-known equal loudness contours in a manner known in the art. The aggressiveness of noise suppression may be controlled by the noise estimate 308 including spectral weighting to achieve a good compromise between speech quality and masking background noise. It is understood that any suitable speech and noise level estimation techniques can be used. In one embodiment, speech and noise level are jointly estimated in a voice activity detection module.

After gain control 302, the enhanced signal is transferred back into time domain 318, equalized 320, and then played back over the loudspeaker(s) 322.

Exemplary embodiments of the invention provide AGC, NDGC, and loss control. In exemplary embodiments of the invention, automatic gain control attenuates the speech signal of loud speakers. As is known in the art, speakers typically speak louder in adverse environments, e.g., high noise situations, known as the Lombard effect. In general, the AGC module tracks speech energy and determines whether the speech volume is still within an acceptable range. If the speech volume exceeds a certain limit, the ICC gain is reduced relatively rapidly. Otherwise, attenuation is slowly reduced.

Noise Dependent Gain Control (NDGC) provides a constant audio impression for listeners. Since the background noise level in automotive environments is highly time variant, the ICC system adapts voice amplification continuously. Beyond a given noise threshold, the ICC gain is continuously increased according to configurable NDGC characteristics. NDGC is expected to react relatively slowly to moderate changes in background noise.

Loss control is used in a bidirectional ICC system having two or more independent ICC systems. Loss control avoids closed-loop amplification of both ICC systems by applying appropriate attenuation for the inactive ICC system. Loss control ensures fast switching in case of speaker changes between speakers in the front and the rear of a car. Loss control ensures that only one ICC system is active at a given time.

Exemplary embodiments of the invention fuse AGC, NDGC and loss control in a gain control module that uses a target function to provide a relatively constant audio impression for listeners given by a selected SNR target range at the listener's position. In one embodiment, a natural audio impression is achieved by using psychoacoustic measures to determine the actual SNR and the target SNR. The fact that a listener hears both the loudspeaker output signal and the direct sound from the speaker can be taken into consideration since the superposition of both signals affects some other psychoacoustic effects such as acoustic localization.

Figure 4:
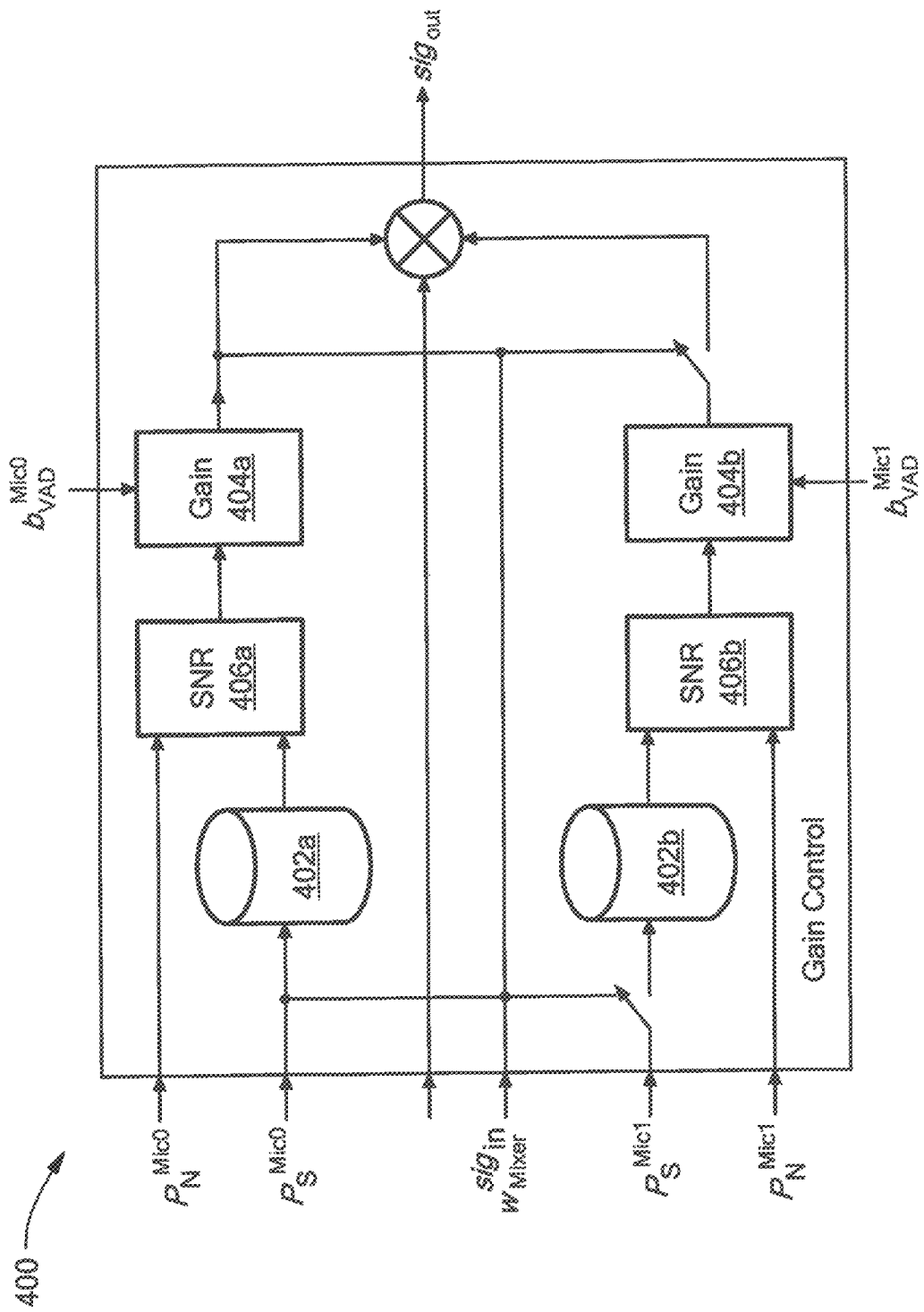
FIG. 4 is a schematic representation of a gain control module that can form a part of the system of FIG. 3.

FIG. 4 shows an exemplary gain control module 400, which can be provided as the gain control module 302 of FIG. 3. As noted above, speakers typically differ in speech volume, which complicates designing an ICC system that supports all speakers in the same manner. With respect to system stability, speakers who speak loudly can be more problematic. On the other hand, one can expect that loud speakers are more intelligible for other passengers since they achieve better Signal-to-Noise Ratios (SNR). In this case less amplification of the system is required.

Noise estimate modules 308a,b (FIG. 3) provide respective noise estimate signals $p_N^{Mic0}$, $p_N^{Mic1}$ for the signals from the first and second microphones 304a,b. Speech estimate modules 312a,b provide speech estimate signals $p_S^{Mic0}$, $p_S^{Mic1}$ for the signals from the first and second microphones 304a,b. The weighting factors $\omega_{Mixer}$ and the input signal $sig_{In}$ are provided by the signal mixer 316. The voice activity detection (VAD) modules 314a,b provide respective signals for the first and second microphones $b_{VAD}^{Mic0}$, $b_{VAD}^{Mic1}$ to indicate which speaker, e.g., driver or front passenger, is active. The gain control module 400 provides an output signal $sig_{out}$ that can be equalized across the various channels, as described above.

In an exemplary embodiment, the speech level estimate signals $p_S^{Mic0}$, $p_S^{Mic1}$ are buffered 402a,b for each speaker separately. In general, noise and speech estimates can be adapted independently during speech pauses/speech utterances. Based on noise and speech level estimates $p_N^{Mic0}$, $p_N^{Mic1}$, $p_S^{Mic0}$, $p_S^{Mic1}$, the gain 404a,b is calculated to achieve a predetermined SNR range 406a,b at the listener's ear. In addition to a target SNR range, the VAD tags $b_{VAD}^{Mic0}$, $b_{VAD}^{Mic1}$ can be used to attenuate the ICC gain during long speech pauses to avoid high amplification of residual background noise or non-stationary noise. The mixer weights $\omega_{Mixer}$ determine which speaker-specific gain should be used which can be useful in cross-talk situations.

In exemplary embodiments of the invention, instead of calculating AGC based on speech level and NDGC based on noise level independently, a target function achieves an approximately constant SNR range with respect to the listener's ear position. To avoid mismatches between perceived and measured SNRs, the use of psychoacoustic measures may be helpful, as noted above.

As long as the ICC gain is relatively small compared to the inverse of the coupling factor representing the feedback from loudspeaker to microphone, a proportional relation is expected between the increase in gain and the resulting SNR. When ICC gain approaches the maximum gain, it is expected that the resulting SNR reacts disproportionately high on increasing the ICC gain. For example, the coupling factors can be used for speaker-to-microphone, speaker-to-listener and loudspeaker-to-listener and the corresponding delays, in order to estimate the SNR at the listener's ear position based on the SNR measured at the microphone. Furthermore, a model of the audio localization can be created according to the Haas effect. Both help achieve a constant audio impression for the listener and to improve the audio localization for speaker and listener.

In one embodiment, this is achieved by an appropriate upper limit of the ICC gain. In a bidirectional ICC system the microphones dedicated to the listener can be used in order to measure the SNR directly.

A bidirectional system, such as the system shown in FIG. 2B, can use the microphone configuration to estimate the ratio of direct sound and loudspeaker output signal. A loss control module can evaluate the power ratio of the microphone signal and the direct sound recorded by the listener's microphone in case of single-talk scenarios. In one embodiment, the system measures this ratio a priori and allows some adaptation in a predetermined range. For example, this can be used to detect whether the driver turns his head while speaking. This would increase the direct sound and lower the signal power measured at the microphone.

In an exemplary embodiment, a target gain and an actual gain are used. Actual gain refers to the gain which is directly applied to the speech signal. The actual gain is continuously adapted to follow the target gain. In one embodiment, the target gain is calculated as follows:

$$G_{target}(\Omega) = \min\{G(\Omega), G_{max}(\Omega)\} \quad (1)$$

where G denotes the gain necessary to achieve the target SNR. For example: G[dB]=SNR_target[dB]−SNR_measured[dB] so that the SNR estimates include knowledge about speech level and background noise, as well as the psychoacoustic weighting. In equation (1) above, G is limited to obtain the target gain which should be achieved. Equation (2) below defines the adaptation scheme if conditions (3) and (4) are fulfilled.

The gain can be calculated for each frequency separately or it can be averaged over all frequencies or a given frequency band. The maximum gain Gmax is the limit where the feedback from loudspeaker to microphone severely affects system stability and sound quality. In addition, the limit Gmax can be controlled adaptively. For example, if instabilities are detected, one could reduce the gain only for a few frequencies instead of reducing the gain for all frequencies. Spectral weighting factors of other modules such as noise suppression can also be taken into account.

The actual gain is adapted step-by-step until the target gain $G_{target}$ is reached in order to achieve smooth gain transitions. Target gain and actual gain are compared to obtain the gain increment/decrement defined below:

$$G_\Delta[dB] = (G_{target}[dB] - G_{actual}[dB]) \cdot \Delta_{inc/dec} \quad (2)$$

The gain increment is applied to the actual gain. By using an adaptive gain, the ICC gain will react slightly on small log-ratios but will adapt rapidly on large values. The first effect stabilizes the audio impression in relatively time-invariant acoustic environments. The second effect minimizes the delay of gain control in case of rapid changes.

In one embodiment, the gain increases only if the SNR at the listener's ear position is lower than the predefined SNR range:

$$SNR < SNR_{min} \Rightarrow G_\Delta[dB] > 0 \quad (3)$$

On the other hand, the gain should be decreased only if the SNR is too high:

$$SNR > SNR_{max} \Rightarrow G_\Delta[dB] < 0 \quad (4)$$

This arrangement combines NDGC and AGC in one gain control module. In addition, a SNR range [SNRmin; SNRmax] is useful to preserve natural SNR fluctuations during speech utterances. In one embodiment, the SNR range is adapted when the noise level increases to reflect the Lombard effect.

Figure 5:
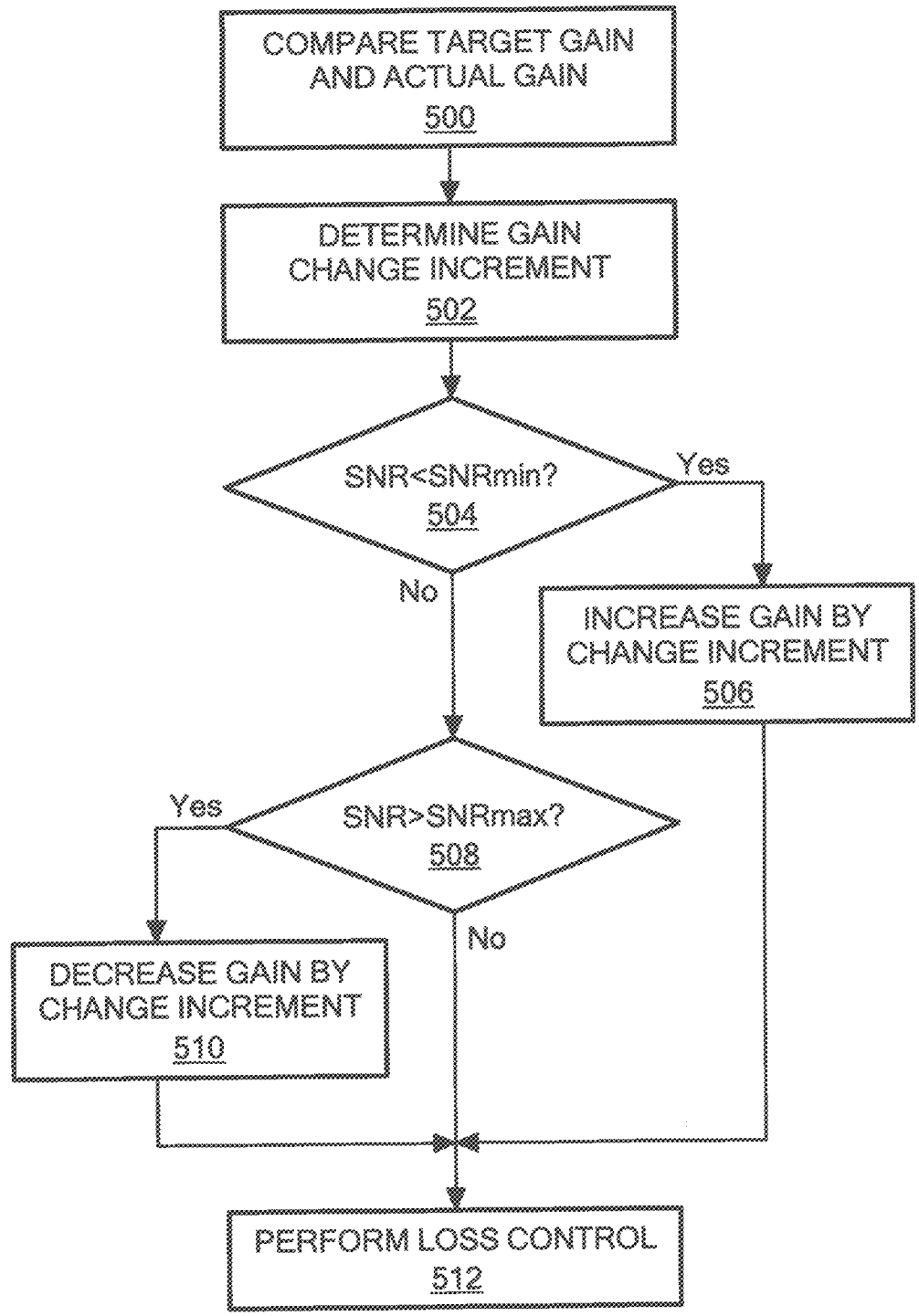
FIG. 5 is a flow diagram of an exemplary sequence of steps for implementing gain control.

FIG. 5 shows an exemplary sequence of steps for implementing gain control. In step 500, target and actual gain are compared. From the comparison, a gain change increment is determined in step 502. In step 504, it is determined whether the SNR is less than a minimum SNR of the SNR range. If so, in step 506 the gain is incremented by the computed gain change increment. If not, in step 508 it is determined whether the SNR is greater than a maximum SNR of the SNR range. If so, in step 510 the gain is decreased by the computed gain change increment. After any gain increase/decrease, optional loss control is performed in step 512.

A bidirectional system, such as that shown in FIG. 2B, requires gain control for the multiple ICC systems 150a,b. In one embodiment, an appropriate upper limit Gmax is set in accordance with Equation (1) to block the loudspeaker output of the inactive ICC system. A large difference of actual and target gain results in rapid adaptation and small delay.

It is understood that any suitable speaker activity detection (SAD) can be used for the VAD module 314a,b of FIG. 3. It is further understood that SAD and VAD are herein used interchangeably. An exemplary SAD system is shown and described in T. Matheja, M. Buck, and T. Fingscheidt, entitled "Speaker Activity Detection for Distributed Microphone Systems in Cars," Proc. of the 6th Biennial Workshop on Digital Signal Processing for In-Vehicle Systems, September, 2013, which is incorporated herein by reference.

Figure 6:
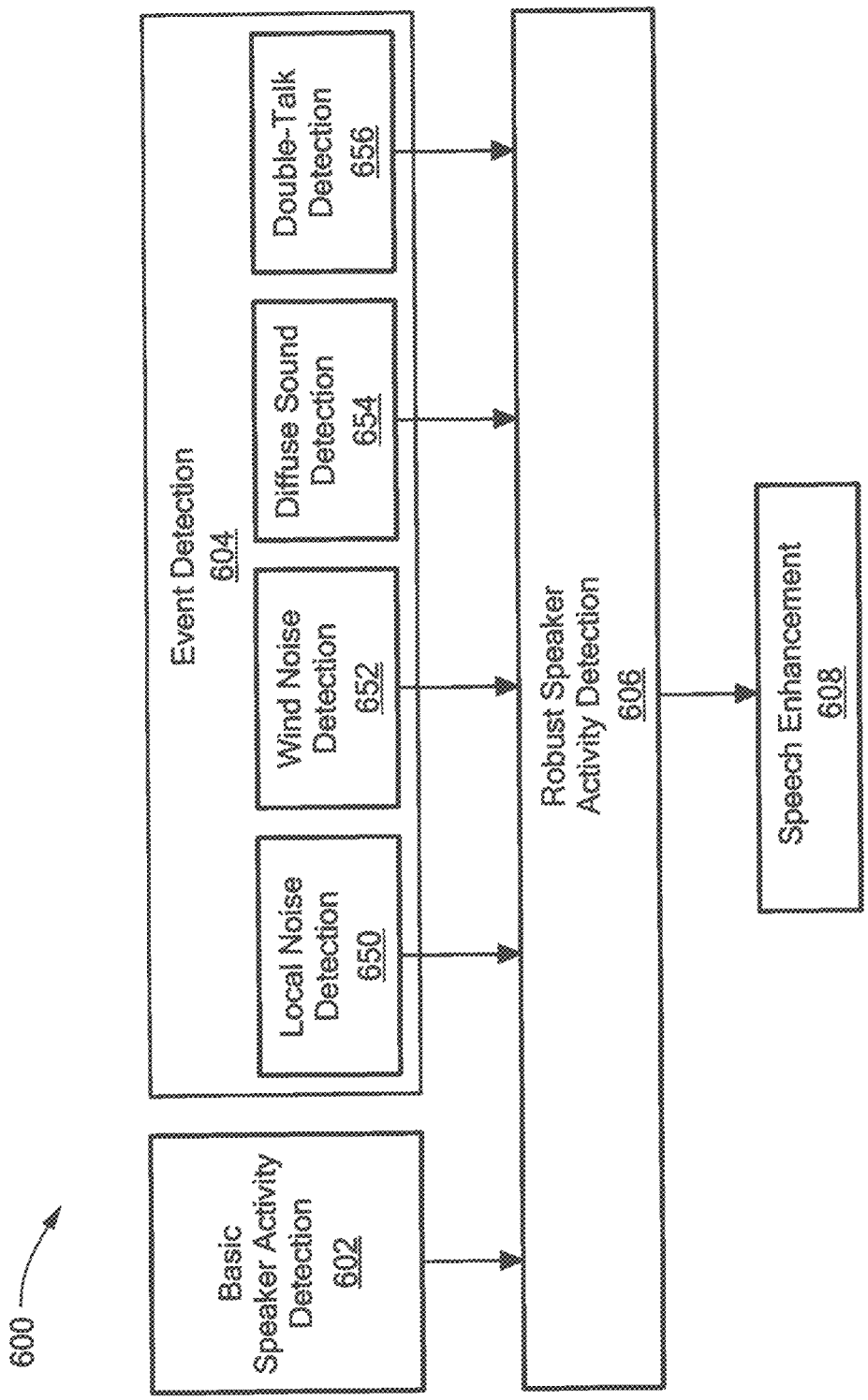
FIG. 6 is a schematic representation of a speech signal enhancement system having exemplary robust speaker activity detection that can be used in the gain control system of FIG. 3.

An exemplary SAD system is shown in FIG. 6, which shows an exemplary speech signal enhancement system 600 having a speaker activity detection (SAD) module 602 and an event detection module 604 coupled to a robust speaker detection module 606 that provides information to a speech enhancement module 608. In one embodiment, the event detection module 604 includes at least one of a local noise detection module 650, a wind noise detection module 652, a diffuse sound detection module 654, and a double-talk detection module 656.

The basic speaker activity detection (SAD) module 602 output is combined with outputs from one or more of the event detection modules 650, 652, 654, 656 to avoid a possible positive SAD result during interfering sound events. A robust SAD result can be used for further speech enhancement 608.

It is understood that the term robust SAD refers to a preliminary SAD evaluated against at least one event type so that the event does not result in a false SAD indication, wherein the event types include one or more of local noise, wind noise, diffuse sound, and/or double-talk.

In one embodiment, the local noise detection module 650 detects local distortions by evaluation of the spectral flatness of the difference between signal powers across the microphones, such as based on the signal power ratio. The spectral flatness measure in channel m for $\tilde{K}$ subbands, can be provided as:

$$\chi_{m,\tilde{K}}^{SF}(\ell) = \frac{\exp\left\{\frac{1}{\tilde{K}} \cdot \sum_{k=0}^{\tilde{K}-1} \log(\max\{\mathrm{SPR}_m(\ell, k), \epsilon\})\right\}}{\frac{1}{\tilde{K}} \cdot \sum_{k=0}^{\tilde{K}-1} \max\{\mathrm{SPR}_m(\ell, k), \epsilon\}} \quad (5)$$

Energy-based speaker activity detection (SAD) evaluates a signal power ratio (SPR) in each of M≥2 microphone channels. In embodiments, the processing is performed in the discrete Fourier transform domain with the frame index l and the frequency subband index k at a sampling rate of $f_s$=16 kHz, for example.

Temporal smoothing of the spectral flatness with γSF can be provided during speaker activity ($\tilde{SAD}_m(\ell)$>0) and decreasing with $\gamma_{dec}^{SF}$ when there is not speaker activity as set forth below:

$$\overline{\chi}_{m,\tilde{K}}^{SF}(\ell) = \begin{cases} \gamma_{SF} \cdot \overline{\chi}_{m,\tilde{K}}^{SF}(\ell-1) + (1-\gamma_{SF}) \cdot \chi_{m,\tilde{K}}^{SF}(\ell), & \text{if } \tilde{SAD}_m(\ell) > 0, \\ \gamma_{dec}^{SF} \cdot \overline{\chi}_{m,\tilde{K}}^{SF}(\ell-1), & \text{else.} \end{cases} \quad (6)$$

In one embodiment, the smoothed spectral flatness can be thresholded to determine whether local noise is detected.

Local Noise Detection (LND) in channel m with $\tilde{K}$: whole frequency range and threshold $\Theta_{LND}$ can be expressed as follows:

$$LND_m(\ell) = \begin{cases} 1, & \text{if } \overline{\chi}_{m,\tilde{K}}^{SF}(\ell) > \Theta_{LND}, \\ 0, & \text{else.} \end{cases} \quad (7)$$

In one embodiment, the wind noise detection module 650 thresholds the smoothed spectral flatness using a selected maximum frequency for wind. Wind noise detection (WIND) in channel m with $\tilde{K}$ being the number of subbands up to, e.g., 2000 Hz and the threshold $\Theta_{WND}$ can be expressed as:

$$WND_m(\ell) = \begin{cases} 1, & \text{if } (\overline{\chi}_{m,\tilde{K}}^{SF}(\ell) > \Theta_{WND}) \wedge (LND_m(\ell) < 1), \\ 0, & \text{else.} \end{cases} \quad (8)$$

It is understood that the maximum frequency, number of subbands, smoothing parameters, etc., can be varied to meet the needs of a particular application. It is further understood that other suitable wind detection techniques known to one of ordinary skill in the art can be used to detect wind noise.

In an exemplary embodiment, the diffuse sound detection module 354 indicates regions where diffuse sound sources may be active that might harm the speaker activity detection. Diffuse sounds are detected if the power across the microphones is similar. The diffuse sound detection module is based on the speaker activity detection measure $\chi_m^{SAD}(\ell)$. To detect diffuse events a certain positive threshold has to be exceeded by this measure in all of the available channels, whereas $\chi_m^{SAD}(\ell)$ has to be always lower than a second higher threshold.

In one embodiment, the double-talk module 356 estimates the maximum speaker activity detection measure based on the speaker activity detection measure $\chi_m^{SAD}(\ell)$ set forth above, with an increasing constant $\gamma_{inc}^{\chi}$ applied during fullband speaker activity if the current maximum is smaller than the currently observed SAD measure. The decreasing constant $\gamma_{dec}^{\chi}$ is applied otherwise, as set forth below.

$$\hat{\chi}_{max,m}^{SAD}(\ell) = \begin{cases} \hat{\chi}_{max,m}^{SAD}(\ell-1) + \gamma_{inc}^{\chi}, & \text{if } \left(\hat{\chi}_{max,m}^{SAD}(\ell-1) < \chi_m^{SAD}(\ell)\right) \wedge (\tilde{SAD}_m(\ell) > 0), \\ \max\{\hat{\chi}_{max,m}^{SAD}(\ell-1) - \gamma_{dec}^{\chi}, -1\}, & \text{else.} \end{cases} \quad (9)$$

Temporal smoothing of the speaker activity measure maximum can be provided with $\gamma_{SAD}$ as follows:

$$\overline{\chi}(\ell) = \gamma_{SAD} \cdot \overline{\chi}_{max,m}^{SAD}(\ell-1) + (1-\gamma_{SAD}) \cdot \hat{\chi}_{max,m}^{SAD}(\ell). \quad (10)$$

Double talk detection (DTD) is indicated if more than one channel shows a smoothed maximum measure of speaker activity larger than a threshold $\Theta_{DTD}$, as follows:

$$DTD(\ell) = \begin{cases} 1, & \text{if } \left(\left(\sum_{m=1}^{M} f(\overline{\chi}_{max,m}^{SAD}(\ell), \Theta_{DTD})\right) > 1\right), \\ 0, & \text{else.} \end{cases} \quad (11)$$

Here the function $f(x, y)$ performs threshold decision:

$$f(x, y) = \begin{cases} 1, & \text{if } x > y, \\ 0, & \text{else.} \end{cases} \quad (12)$$

With the constant $\gamma_{DTD} \in \{0, \ldots, 1\}$ we get a measure for detection of double-talk regions modified by an evaluation of whether double-talk has been detected for one frame:

$$\overline{X}^{DTD}(\ell) = \begin{cases} \gamma_{DTD} \cdot \overline{X}^{DTD}(\ell-1) + (1-\gamma_{DTD}), & \text{if } DTD(\ell) > 0, \\ \gamma_{DTD} \cdot \overline{X}^{DTD}(\ell-1), & \text{else.} \end{cases} \quad (13)$$

The detection of double-talk regions is followed by comparison with a threshold:

$$\widetilde{DTD}(\ell) = \begin{cases} 1, & \text{if } \overline{X}^{DTD}(\ell) > \Theta_{DTD}, \\ 0, & \text{else.} \end{cases} \quad (14)$$

Figure 7:
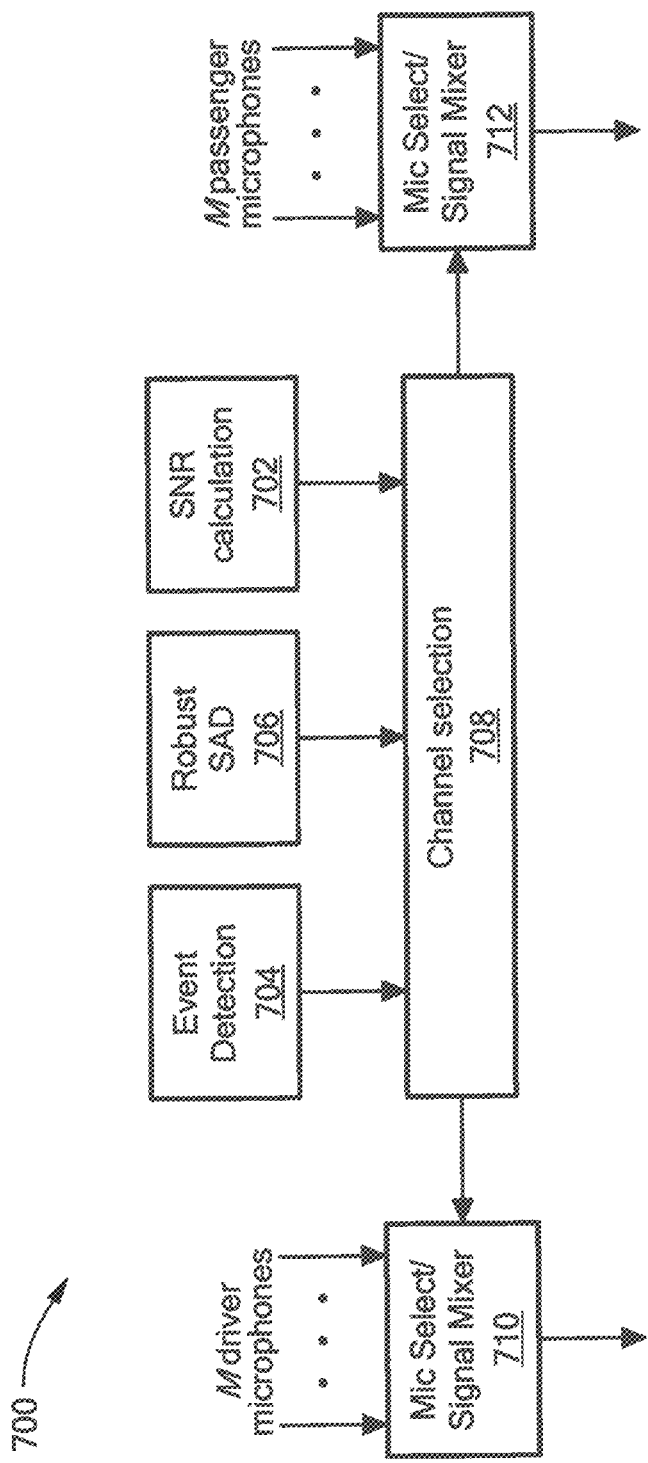
FIG. 7 is a schematic representation of an exemplary microphone selection system having robust speaker activity detection.

FIG. 7 shows an exemplary microphone selection system 700 to select a microphone channel using information from a SNR module 702, an event detection module 704, which can be similar to the event detection module 604 of FIG. 6, and a robust SAD module 706, which can be similar to the robust SAD module 606 of FIG. 6, all of which are coupled to a channel selection module 708. A first microphone select/signal mixer 710, which receives input from M driver microphones, for example, is coupled to the channel selection module 708. Similarly, a second microphone select/signal mixer 712, which receives input from M passenger microphones, for example, is coupled to the channel selection module 708. As described more fully below, the channel selection module 708 selects the microphone channel prior to any signal enhancement processing. Alternatively, an intelligent signal mixer combines the input channels to an enhanced output signal. By selecting the microphone channel prior to signal enhancement, significant processing resources are saved in comparison with signal processing of all the microphone channels.

When a speaker is active, the SNR calculation module 702 can estimate SNRs for related microphones. The channel selection module 708 receives information from the event detection module 704, the robust SAD module 706 and the SNR module 702. If the event of local disturbances is detected locally on a single microphone, that microphone should be excluded from the selection. If there is no local distortion, the signal with the best SNR should be selected. In general, for this decision, the speaker should have been active.

In one embodiment, the two selected signals, one driver microphone and one passenger microphone can be passed to a further signal processing module (not shown), that can include noise suppression, for example. Since not all channels need to be processed by the signal enhancement module, the amount of processing resources required is significantly reduced.

In one embodiment adapted for a convertible car with two passengers with in-car communication system, speech communication between driver and passenger is supported by picking up the speaker's voice over microphones on the seat belt or other structure, and playing the speaker's voice back over loudspeakers close to the other passenger. If a microphone is hidden or distorted, another microphone on the belt can be selected. For each of the driver and passenger, only the 'best' microphone will be further processed.

Alternative embodiments can use a variety of ways to detect events and speaker activity in environments having multiple microphones per speaker. In one embodiment, signal powers/spectra $\Phi_{SS}$ can be compared pairwise, e.g., symmetric microphone arrangements for two speakers in a car with three microphones on each seat belts, for example. The top microphone m for the driver Dr can be compared to the top microphone of the passenger Pa, and similarly for the middle microphones and the lower microphones, as set forth below:

$$\Phi_{SS,Dr,m}(\ell,k) \leftrightarrow \Phi_{SS,Pa,m}(\ell,k) \quad (15)$$

Events, such as wind noise or body noise, can be detected for each group of speaker-dedicated microphones individually. The speaker activity detection, however, uses both groups of microphones, excluding microphones that are distorted.

In one embodiment, a signal power ratio (SPR) for the microphones is used:

$$SPR_m(\ell, k) = \frac{\Phi_{SS,m}(\ell, k)}{\Phi_{SS,m'}(\ell, k)} \quad (16)$$

Equivalently, comparisons using a coupling factor K that maps the power of one microphone to the expected power of another microphone can be used, as set forth below:

$$\Phi_{SS,m}(\ell,k) \cdot K_{m,m}(\ell,k) \leftrightarrow \Phi_{SS,m}(\ell,k) \quad (17)$$

The expected power can be used to detect wind noise, such as if the actual power exceeds the expected power considerably. For speech activity of the passengers, specific coupling factors can be observed and evaluated, such as the coupling factors K above. The power ratios of different microphones are coupled in case of a speaker, where this coupling is not given in case of local distortions, e.g. wind or scratch noise.

Figure 8:
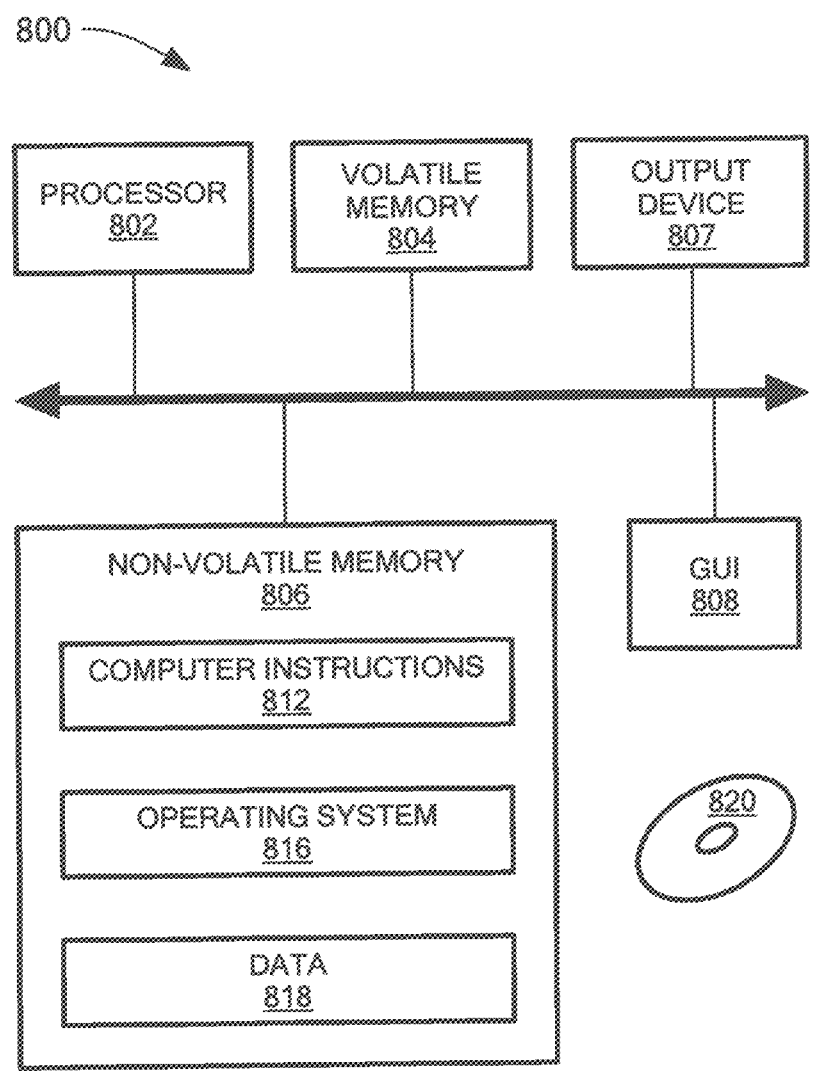
FIG. 8 is a schematic representation of an exemplary computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
    for a communication system having microphones and loudspeakers, transforming a signal received by a first one of the microphones to the frequency domain;
    determining a noise level estimate for the transformed signal;
    determining a speech level estimate for the transformed signal;
    determining a SNR from the noise and speech level estimates; and
    determining a gain for the transformed signal to achieve a selected SNR range at a given position, wherein determining the gain comprises:
      adapting an actual gain to follow a target gain, wherein the target gain is adjusted to achieve the selected SNR range;
      comparing the target gain and the actual gain to determine a gain change increment;
      increasing the actual gain if the SNR at the given position is lower than a minimum SNR in the SNR range; and
      decreasing the actual gain if the SNR at the given position is higher than a maximum SNR in the SNR range.
2. The method according to claim 1, further including adapting the SNR range in response to a change in the noise level.
3. The method according to claim 1, further including using a psychoacoustic measure for determining the noise and/or speech level estimate.
4. The method according to claim 3, further including determining a noise level estimate for the transformed signal using spectral weights based upon the psychoacoustic measure.
5. The method according to claim 1, further including performing voice activity detection on the transformed signal and generating weighting factors from the voice activity detection to detect an active speaker.
6. The method according to claim 5, further including determining mixer weights to select a speaker-specific gain for the active speaker.
7. The method according to claim 5, further including attenuating the gain during speech pauses detected by the voice activity detection.
8. The method according to claim 1, further including determining the gain for different frequencies.
9. The method according to claim 1, further including, in a bi-directional system, setting a maximum gain to block a loudspeaker output of an inactive communication system.
10. The method according to claim 9, further including using a first one of the microphones to determine the SNR at the given position.
11. The method according to claim 1, wherein the given position corresponds to a position proximate an expected location of a user ear.
12. An article, comprising:
    a non-transitory computer-readable medium having stored instructions than enable a machine to:
    for a communication system having microphones and loudspeakers, transform a signal received by a first one of the microphones to the frequency domain;
    determine a noise level estimate for the transformed signal;
    determine a speech level estimate for the transformed signal;
    determine a SNR from the noise and speech level estimates; and
    determine a gain for the transformed signal to achieve a selected SNR range at a given position, wherein determining the gain comprises:
      adapt an actual gain to follow a target gain, wherein the target gain is adjusted to achieve the selected SNR range;
      compare the target gain and the actual gain to determine a gain change increment;
      increase the actual gain if the SNR at the given position is lower than a minimum SNR in the SNR range; and
      decrease the actual gain if the SNR at the given position is higher than a maximum SNR in the SNR range.
13. The article according to claim 12, further including instructions to adapt the SNR range in response to a change in the noise level.
14. The article according to claim 12, further including instructions to use a psychoacoustic measure for determining the noise and/or speech level estimate.
15. The article according to claim 12, further including instructions to perform voice activity detection on the transformed signal and generate weighting factors from the voice activity detection to detect an active speaker.
16. The article according to claim 15, further including instructions to determine mixer weights to select a speaker-specific gain for the active speaker.
17. The article according to claim 12, further including, in a bi-directional system, instructions to set a maximum gain to block a loudspeaker output of an inactive communication system.
18. A communication system, comprising:
    microphones to receive sound in an enclosed environment;
    loudspeakers to generate sound into the enclosed environment;

a sound processing module to transform a signal received by a first one of the microphones to the frequency domain;

a noise estimate module to determine a noise level estimate for the transformed signal;

a speech estimate module to determine a speech level estimate for the transformed signal;

a gain control module comprising:

a SNR module to determine a SNR from the noise and speech level estimates; and a gain module to determine a gain for the transformed signal to achieve a selected SNR range at a given position, the gain module including a processor configured to: adapt an actual gain to follow a target gain, wherein the target gain is adjusted to achieve the selected SNR range;

compare the target gain and the actual gain to determine a gain change increment;

increase the actual gain if the SNR at the given position is lower than a minimum SNR in the SNR range; and decrease the actual gain if the SNR at the given position is higher than a maximum SNR in the SNR range.

19. The system according to claim 18, wherein the gain module is further configured to adapt the SNR range in response to a change in the noise level.

20. The system according to claim 18, wherein the noise estimate module is configured to use a psychoacoustic measure for determining the noise level estimate.

* * * * *